(12) United States Patent
Delapierre

(10) Patent No.: US 6,825,491 B2
(45) Date of Patent: Nov. 30, 2004

(54) INTEGRATED VARIABLE ELECTRICAL CAPACITANCE DEVICE AND METHOD FOR PRODUCING SAID DEVICE

(75) Inventor: Gilles Delapierre, Seyssins (FR)

(73) Assignee: Commissariat a l'Energie Atomique, Paris (FR)

(*) Notice: Subject to any disclaimer, the term of this patent is extended or adjusted under 35 U.S.C. 154(b) by 209 days.

(21) Appl. No.: 10/270,064

(22) Filed: Oct. 15, 2002

(65) Prior Publication Data

US 2003/0085450 A1 May 8, 2003

(30) Foreign Application Priority Data

Oct. 17, 2001 (FR) ............................................. 01 13371

(51) Int. Cl.$^7$ ............................................. H01L 29/04
(52) U.S. Cl. ............................. 257/53; 257/50; 257/51; 257/52
(58) Field of Search ....................................... 257/50–53

(56) References Cited

U.S. PATENT DOCUMENTS 6,034,414 A  3/2000  Lin
6,110,791 A  8/2000  Kalnitsky et al.

FOREIGN PATENT DOCUMENTS

DE     100 02 363     8/2001

OTHER PUBLICATIONS

K. F. Harsh, et al., Sensors and Actuators, vol. 80, No. 2, pp. 108–118, XP–004192096, "The Realization And Design Considerations of a Flip–Chip Integrated MEMS Tunable Capacitor", Mar. 2000.

J. J. Yao, J. Micromech. Microeng., vol. 10, pp. 9–38, "Topical Review RF MEMS from a Device Perspective", 2000.

Primary Examiner—Fetsum Abraham
(74) Attorney, Agent, or Firm—Oblon, Spivak, McClelland, Maier & Neustadt, P.C.

(57) ABSTRACT

The present invention concerns an integrated variable capacitance device comprising at least one membrane (12) forming at least one mobile armature and having at least one principal face facing at least one fixed armature. In accordance with the invention, the membrane has at least one rigidity rib (32) lying in a perpendicular direction to said principal face.

Application in the production of resonant filters.

5 Claims, 5 Drawing Sheets

INTEGRATED VARIABLE ELECTRICAL CAPACITANCE DEVICE AND METHOD FOR PRODUCING SAID DEVICE

TECHNICAL FIELD

The present invention concerns an integrated variable electrical capacitance device and a method for collectively producing said devices.

The term variable electrical capacitance device is taken to mean any device or component that comprises one or several chip capacitors whose electrical capacitance can be modified.

Such devices are used, for example, for producing resonant filters that one wishes to tune to different frequencies.

A specific application of variable capacitance devices is producing telecommunications equipment by radio relay channels. The integrated character of variable capacitances is dictated by the imperatives of miniaturisation of the equipment concerned.

STATE OF THE PRIOR ART

A description of the prior art is given in the document (1) whose references are detailed at the end of the description. Additional information may be found in documents (2) to (4) whose references are also detailed at the end of the description.

An integrated electrical capacitance generally comprises a fixed armature and a mobile armature arranged facing each other, and mutually insulated. The mobile armature may be formed or supported by a membrane. The mobility of the armature may result from the flexible and deformable character of the membrane, or due to the fact that said membrane is linked to a support fastened via flexible means, such as small joists.

The space separating the armatures may be a vacuum or may contain a gas. The variable capacitance is generally associated with control drive means. This makes it possible to displace the mobile armature in relation to the fixed armature. The displacement of the mobile armature has the effect of modifying the distance separating the facing armatures and thus modifying the capacitance of the capacitor formed by the armatures.

In essence, three types of drive means that can be used for controlling the displacement of the mobile armature are known. Thus one distinguishes electrostatic means, piezoelectric means and differential expansion thermal means (bimetallic strip).

Among these means, electrostatic control is generally preferred. This type of control is preferred for the simplicity of its production and for its reduced power consumption. Electrostatic drive means use electrodes between which one generates electrostatic forces by applying a potential difference. The forces are profitably employed for displacing the mobile armature.

However, with highly miniaturised devices, an important difficulty arises in supplying the control voltage required for the exercise of the electrostatic forces. This is around 10 to 100 volts.

A possible solution for limiting the control voltage consists in making the joists that maintain the mobile armature more flexible. Improved joist flexibility makes it possible, in fact, to use a lower control voltage.

On the other hand, it also increases the sensitivity of the device to accelerations. In this respect, the reader may refer to documents (2) and (3), which propose profitably using the sensitivity of a mobile armature to acceleration to the production of an accelerometer.

However, in the devices covered by the present description, the accelerations, including that of gravity, have the effect of displacing the mobile armature and generating uncontrollable variations in the capacitance. This phenomenon is particularly troublesome in portable equipment, subjected to strong and repeated accelerations.

This undesirable effect may be reduced by using mobile armatures in the form of very thin membranes, or borne by such membranes. Their light weight makes them, in fact, less sensitive to acceleration.

However, the use of thin membranes causes other difficulties. For example, the resonance modes of the membranes, at low frequency, can generate capacitance instabilities. Moreover, very thin membranes are fragile and subject to deformation over time. The result, in particular, is a capacitance drift at rest, in other words capacitance drift in the absence of an applied electrical field.

DESCRIPTION OF THE INVENTION

The aim of the present invention is to propose an integrated variable capacitance device that does not have the above limitations and difficulties.

A particular aim is to propose such a device that has low sensitivity to accelerations and which has, nevertheless, good stability over time, while at the same time having a low electricity consumption and which is capable of being controlled by a low voltage.

A further aim is to propose a reliable device capable of being used in portable telecommunications equipment.

A yet further aim is to propose a method for producing said device.

Finally, an aim of the invention is to propose a method suitable for the collective and concomitant production of a large number of variable capacitance devices.

In order to achieve these aims, the invention concerns more specifically an integrated variable capacitance device comprising at least one membrane forming at least one mobile armature and having at least one principal face facing at least one fixed armature. According to the invention, the membrane is integral with at least one rigidity rib lying in a perpendicular direction to said principal face. Preferably, the rib is as thin as possible in a direction parallel to the principal face.

One considers that the membrane forms a mobile armature when at least one part of the membrane, which can be brought nearer or moved further away from the fixed armature, is in a conductive material, or when the membrane is provided in this part with a layer of conductive material forming one or several armatures. In other words, at least one part of the membrane constitutes or bears an armature.

One considers that the membrane is in a conductive material when said material conducts sufficient electricity to constitute a condenser armature. This does not exclude choosing semi-conductor materials.

The displacement of the mobile armature can take place by deforming the membrane, which then has at least one flexible part, and/or by deforming one or several joists suspending the membrane.

The rib makes it possible to confer to the membrane, and thus to the mobile armature, a good rigidity despite its thinness and thus its lightness. It thereby makes it possible to use thinner membranes than in known devices. The membrane, thus rigidified, has better resistance over time, better stability and at the same time is relatively insensitive to accelerations.

The rib is situated on at least one of the principal faces, in order words one of the faces with the largest surface. This characteristic makes it possible to optimise the stiffening function of the rib(s), but does not prejudice either the shape or the orientation of the membrane.

According to a specific aspect of the invention, the device may comprise a substrate bearing the membrane and forming one or several fixed armatures.

Here again, one considers that the substrate forms a fixed armature when at least one part of the substrate is in a conductive material that can constitute an armature, or when the substrate is provided with one or several conductive layers constituting electrodes and thus forming the fixed armature(s).

In a specific embodiment, the device of the invention may comprise a first part arranged facing a first principal face of the membrane and a second part, integral with the first part, and arranged facing a second principal face of the membrane, at least one of the first and second parts forming a fixed armature.

In the case where the membrane is a flat membrane, the substrate may comprise two fixed armatures, arranged on either side of the membrane, facing its two principal faces. Advantageously, one of the fixed armatures may be used jointly with the mobile armature to form an electrostatic control drive means for the displacement of the membrane. The second fixed armature may then be reserved exclusively for constituting a variable capacitance, with the mobile armature.

It should be pointed out that a same set of fixed and mobile armatures may also be used at the same time as variable capacitance and as electrostatic control drive.

The invention also concerns a method for producing a variable capacitance device in which:

a) One provides a substrate having at least one first thin armature layer linked to a solid part by a buried insulating layer, b) One forms on the first thin armature layer, an etching barrier layer, said etching barrier layer having at least one coupling opening leading into a part of the thin armature layer intended to form a mobile armature, c) One forms at least one rigidity layer covering the etching barrier layer, and coming into contact with the first thin armature layer in the coupling opening, d) One carries out a selective etching of the rigidity layer in order to form at least one rigidity rib extending out above the coupling opening, and on the part of the thin armature layer intended to form a mobile armature, e) One liberates said part by local elimination of the etching barrier layer and the buried insulating layer, in order to form the mobile armature.

Armature layer is taken to mean a layer in conductive, semi-conductive or resistant material, able to constitute one or several condenser armatures.

In one specific embodiment of the method, one can use an etching barrier layer in an electrically insulating material, and a rigidity layer in an electrically conductive material. One thereby preserves, during step d), a part of the rigidity layer extending out above the part of the thin armature layer intended to form a mobile armature, and one mutually liberates said parts of the rigidity layer and the thin armature layer.

The liberation of the armature layer from the rigidity layer makes it possible to form the membrane. This can be done, for example, by local elimination of a sacrificial intercalated layer. This aspect is described in more detail in the text that follows.

The substrate, or more precisely the solid part of the substrate, may be used as a fixed armature, when it is not insulating.

Alternatively, one can also provide, during step a), a substrate that has, moreover, under the first armature layer, a second buried armature layer, electrically insulated from the first armature layer. In this case, one can preserve at least a part of this layer facing the mobile armature, to form a fixed armature.

According to yet another possibility, one can form in the solid part of the substrate a conductive zone forming a fixed armature by ion implantation.

The selective elimination of a sacrificial part of the buried layer may be carried out by making one or several access openings to this layer in order to submit it to etching agents. This operation may be made a great deal simpler when one provides, before the step b), one or several etching openings in the first armature layer.

Other characteristics and advantages of the invention will be made clear from the description that follows, while referring to the appended figures. This description is given solely by way of indication and is in nowise limitative.

DETAILED DESCRIPTION OF EMBODIMENTS OF THE INVENTION

In the description that follows, identical, similar or equivalent parts of different figures are identified by the same reference signs in order to facilitate comparisons between figures. Furthermore, and in order to make the figures clearer, not all of the elements are represented to a uniform scale.

Figure 1:
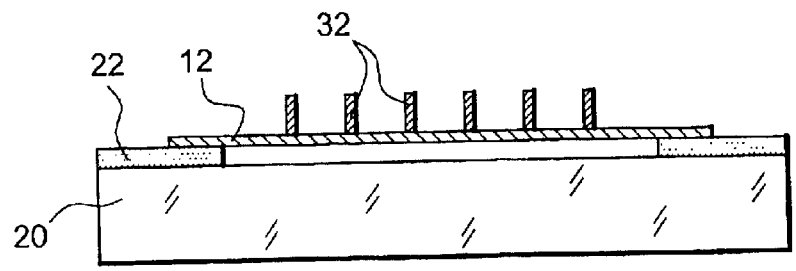
FIG. 1 is a schematic, simplified cross section of a variable capacitance device according to the invention.

FIG. 1 shows a variable capacitance device according to the invention.

Said device comprises a membrane 12 in an electrically conductive material. This is maintained separated, but facing, a support 20 by a separation layer 22 in a dielectric material. The support 20 is also in an electrically conductive material. It forms, with the membrane, the armatures of a variable capacitance condenser. The capacitance can be modified by applying a pressure on the membrane, under the effect of which it slightly distorts, and comes nearer to or moves further away from the support.

The membrane is provided, on its face facing the substrate, with a plurality of thin slices which form rigidity ribs 32. The thin slices can be placed on the membrane or formed in a single piece with said membrane.

The thin slices 32 enable the rigidity of the membrane to be increased and thus to reduce its thickness to very low values. The thickness of the membrane may be less that that which would be necessary for it to be self-supporting in the absence of ribs.

Figure 2:
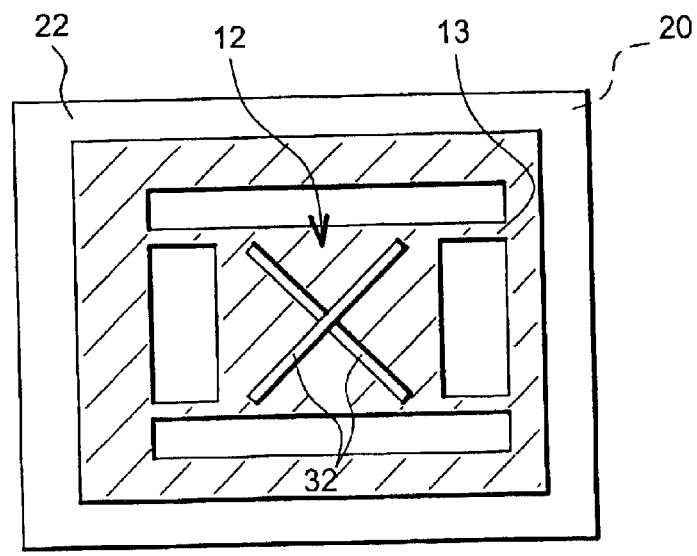
FIG. 2 is a top view, also simplified, of another variable capacitance device according to the invention.

FIG. 2 is a top view of another variable capacitance device according to the invention. In this figure, the membrane 12 also constitutes a mobile armature of a condenser. The mobility of the armature does not result from the flexibility of the membrane but from that of the small joists 13 that suspend the membrane while linking it to the support 20.

The membrane 12 is provided with a rib 32 in a cross shape which extends along the diagonals of one of its principal faces. The opposite principal face is turned towards a non-visible part of the substrate that forms the fixed armature.

Figure 3:
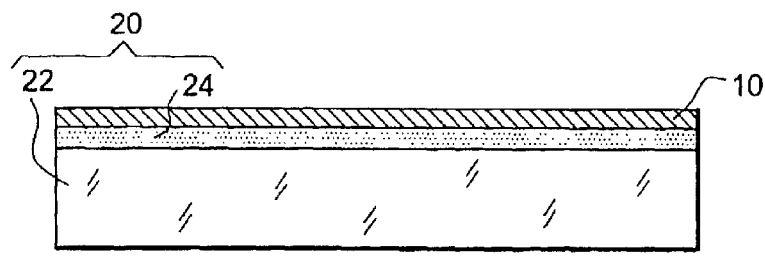
FIGS. 3 to 9 are simplified, schematic cross sections of a substrate, illustrating the successive steps for producing a variable capacitance device according to the method of the invention.

FIG. 3 shows a substrate that can be used for producing a device according to the invention. The substrate 20 comprises a solid part 22 in silicon and a thin superficial layer 10 in silicon, preferably microcrystalline.

The thin layer 10 is linked to the solid part 22 through the intermediary of a buried insulating layer 24. This is, in the example shown, a layer of silicon oxide.

A substrate like that represented in FIG. 3 is known in itself. It involves for example an SOI (silicon on insulator) type substrate. Such substrates are usually formed by placing a thin layer of silicon on a plate of previously oxidised silicon.

It should be pointed out that other substrates having a superficial conductive layer, or covered with a conductive film, and insulated from the solid part may also be used. One may use, for example, a layer of copper or aluminium for the thin layer and dielectric layers, in polymer or glass (PSG), to form the buried layer. The solid part of the substrate may, according to the embodiments, be semi-conductive, insulating or even conductive.

Figure 4:
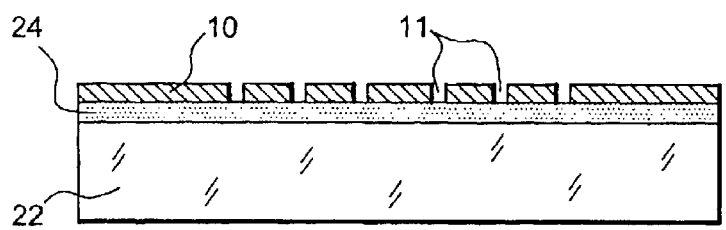

FIG. 4 shows the formation of openings 11 in the thin superficial layer 10. The openings are formed in a central part of the thin superficial layer in which a membrane of the device has to be formed at a later stage. The central part has round it edges a region where the thin superficial layer 10 does not have openings.

The openings 11 may be formed by selective etching of the silicon, stopping on the underlying silicon oxide, according to a pattern determined by a mask. Said mask is not shown.

Figure 5:
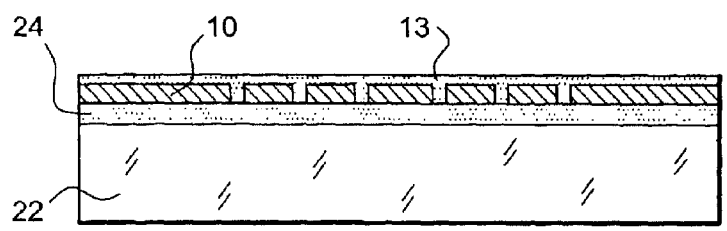

FIG. 5 shows the deposition of a new intercalated layer 13 of silicon oxide that covers the thin superficial layer 10 and which fills the openings 11 formed beforehand. The intercalated layer 13 may be replaced by another layer in an insulating material and capable of being selectively etched in comparison to the material of the thin superficial layer.

Figure 6:
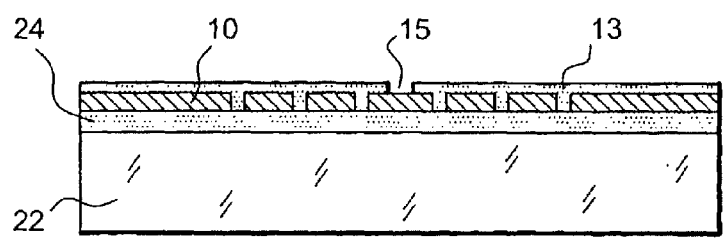

FIG. 6 shows the formation of a coupling opening 15 in the intercalated layer 13, in such a way as to expose a zone of the thin superficial layer 10. Care is taken here to avoid lining up the coupling opening with an opening previously formed in the underlying superficial layer. As will be made clear in the description that follows, the purpose of the coupling opening 15 is to allow a rigidity rib to be fixed on the membrane. Several coupling openings may be provided. They are arranged essentially in a central part where a membrane has to be liberated at a later stage.

Figure 7:
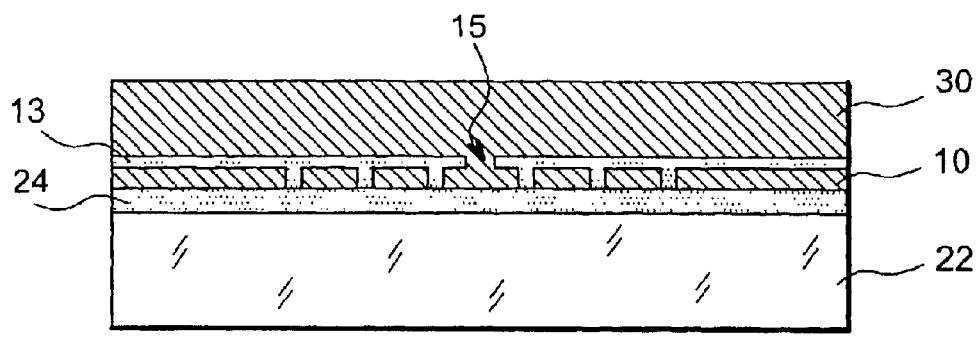

FIG. 7 shows the deposition of a thick layer of polycrystalline silicon 30. The thickness of this layer may be greater than that of the thin layer 10; it sets the thickness of a rib formed at a later stage. The thick layer 30, again designated "rigidity layer", covers the intercalated layer 13 and is fixed on the thin superficial layer 10 in the coupling opening 15.

Figure 8:
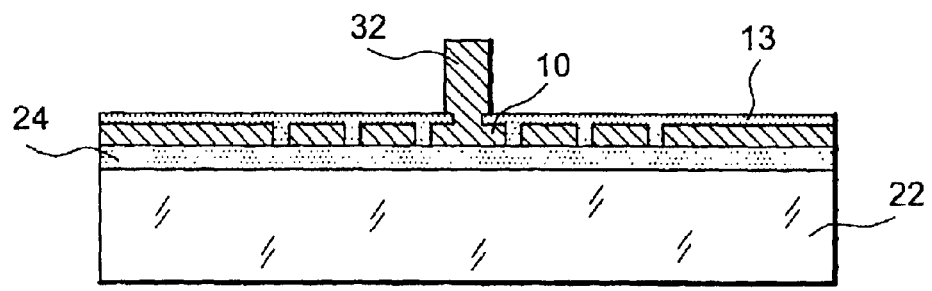
Figure 9:
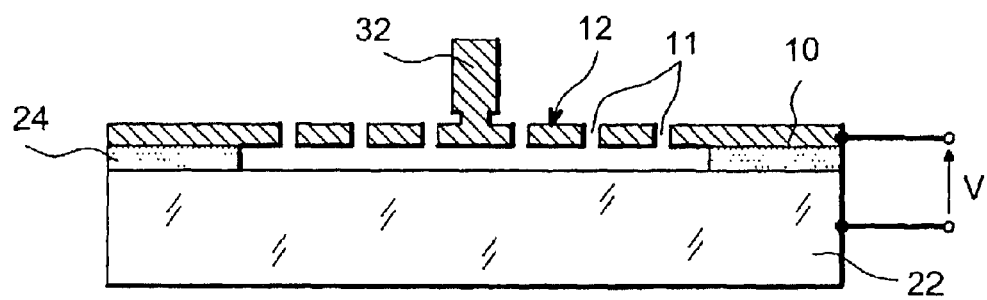

A selective etching of the rigidity layer 30 makes it possible to free a rib 32, shown in FIG. 8. The rib is integral with the thin superficial layer through the coupling opening and can extend in part above the intercalated layer 13. The etching of the thick layer 30, selective compared to the silicon oxide, uses an etching mask that is not represented. This sets the dimensions and the positioning of the rib 13.

A final isotropic and selective etching of the silicon oxide compared to the silicon of the thin superficial layer 10 and the rib 32 makes it possible to eliminate the intercalated layer 13. The same etching also makes it possible to attack the underlying buried layer 22. This attack is possible thanks to the openings 11 previously formed in the thin superficial layer. The isotropic character of the etching enables the silicon oxide to be eliminated also in the regions surrounding the openings 11, up to liberating a part of the thin superficial layer 10 to form the membrane 12.

The membrane 12, freed by the partial elimination of the underlying oxide layer, can be deformed and constitutes a mobile armature. The solid part of the semi-conductor substrate 22 constitutes a fixed armature opposite the membrane.

In the peripheral region surrounding the membrane, the absence of openings in the thin superficial layer means that said layer locally protects the underlying oxide layer during the etching. The remainder of the insulating oxide layer 24 enables the membrane to be suspended and to link it to the solid part of the substrate. The link formed by the remainder of the oxide layer is a mechanical link and not an electrical link. It should be pointed out that the openings 11 in the thin superficial layer could if necessary be replaced by another type of access channel, for example through the solid part 22, in order to allow a liberation etching of the membrane.

The above description illustrates a very rudimentary embodiment of the invention in which the substrate, as a whole, or more precisely its solid part 22 as a whole, constitutes a variable capacitance condenser armature.

Such a production of the device possibly risks inducing electrical insulation difficulties when other components have to be formed in the same substrate. A possibility for restoring to the substrate its exclusively mechanical support function consists in forming on said substrate a fixed armature, electrically insulated.

Figure 10:
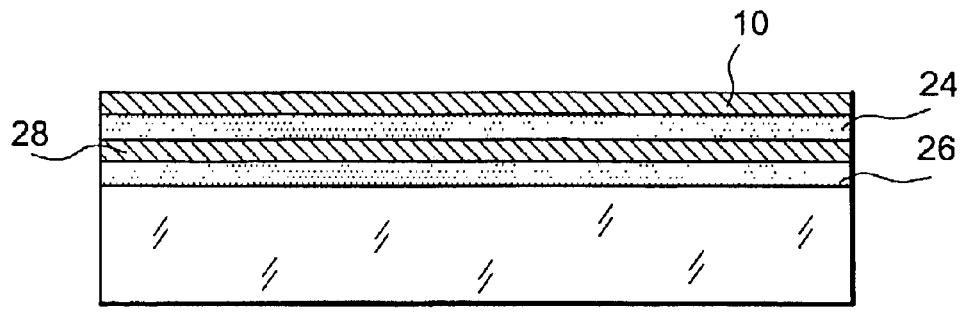
FIGS. 10 and 11 are schematic cross sections of substrates different to that of FIG. 3, which can also be used for producing a device according to the invention.

FIG. 10 shows a substrate that can be used to this effect. The substrate in FIG. 10 comprises a solid part 22, a first buried layer of oxide 24, and a thin superficial layer of silicon 10. These parts are the same as those in FIG. 3. In addition, the substrate in FIG. 10 comprises a second layer of silicon oxide 26 and a thin buried layer of silicon 28 and arranged in this order between the solid part and the first buried layer 24. The second layer of silicon oxide 26 electrically insulates the thin buried layer from the solid part of the substrate. Such a substrate may be obtained easily from a SOI substrate, by adding an oxide layer then a thin layer of silicon. The second thin layer of silicon may, for example, be transferred onto it.

A variable capacitance device may be produced from this substrate according to the method described previously. The buried layer of silicon 28 then plays the role of an etching barrier layer during the attack of the silicon oxide of the first buried layer of oxide during the liberation of the membrane. In the device that is finally obtained, the buried layer of silicon 28 then plays the role of a fixed armature.

Figure 11:
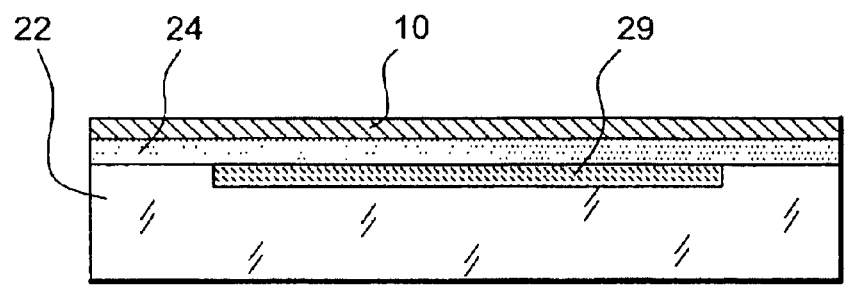

FIG. 11 shows yet another type of substrate capable of being covered. It involves a substrate that conforms to FIG. 3, with a thin superficial layer 10 in monocrystalline or polycrystalline silicon, for example, of a SOI type.

A doped zone 29 is formed by implantation in the solid part of the substrate, under the buried layer. The doping impurities used are of a type of conductivity opposite to that of the solid part. The variable capacitance device is then continued in the fashion already described.

The doped zone 29 is used as a fixed armature and forms a diode with the rest of the solid part. It is polarised in a blocking sense to impede any current leaks.

Figure 12:
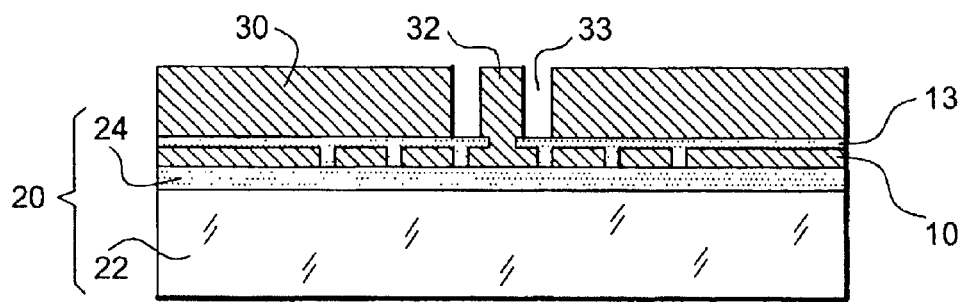
FIGS. 12 and 13 are simplified, schematic cross sections of a substrate illustrating the steps for producing a variable capacitance device according to the method of the invention, and constituting another embodiment compared to the steps in FIGS. 7 to 9.

FIG. 12 illustrates a step of an embodiment of the method, which takes place after the step described in reference to FIG. 7.

The thick layer of silicon 30 is etched according to a mask in order to form cuttings 33. Said cuttings 33 pass through the thick layer of silicon and demarcate within it the rigidity rib(s) 32. The remaining part of the thick layer 30 is nevertheless preserved.

Figure 13:
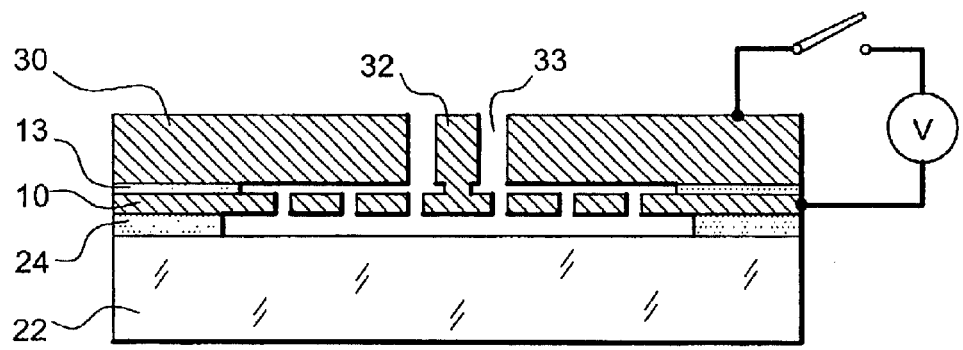

FIG. 13 shows the structure obtained after an attack of the silicon oxide of the buried oxide layer 24 and the intercalated layer 13 through the cuttings 33. This attack, selective compared to silicon, makes it possible to liberate the membrane 12 compared to the solid part 22 of the substrate 20 but also compared to the thick layer of silicon 30. In fact, the anisotropic chemical etching makes it possible to eliminate, also in a local manner, the intercalated layer 13 in the region of the membrane. The remainder of the intercalated layer 13 makes it possible to maintain the thick rigidity layer 30 at a distance from the membrane and to electrically insulate it.

One obtains a double variable capacitance. A first variable capacitance is formed between the solid part of the substrate and the membrane, and the second variable capacitance between the membrane and the remaining part of the rigidity layer 30. Said rigidity layer, when it is sufficiently thick not to be deformed, constitutes in fact a fixed armature. A movement of the membrane provokes a modification in the inverse sense of said two capacitances.

In order to produce the means of control of the variable capacitance, it is possible to use one of the fixed armatures and to apply to it an electrostatic voltage for displacing or deflecting the membrane. This is shown by the symbolic representation of a voltage generator connected between the membrane and the remaining part of the thick layer. The remaining part of the rigidity layer then constitutes a control electrode and the solid part of the substrate a signal electrode.

Figure 14:
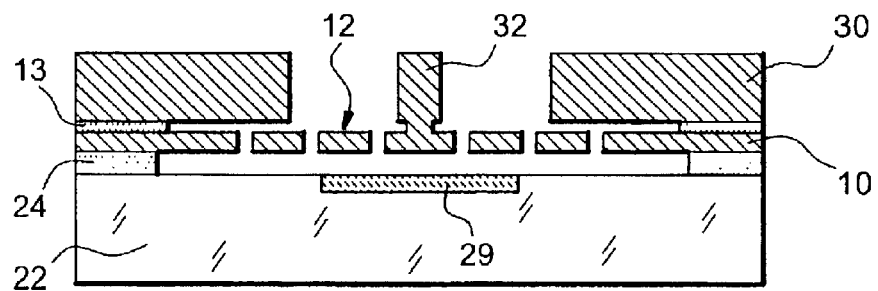
FIG. 14 is a simplified, schematic cross section of a variable capacitance device according to the invention, obtained in accordance with the method illustrated in FIGS. 12 and 13.

FIG. 14 shows a device that conforms to the device in FIG. 13 obtained with a substrate that conforms to the substrate in FIG. 11. It comprises an electrode 29, implanted in the substrate and forming a fixed armature. An implantation masking makes it possible to implant the electrode 29 in a region of the membrane that is not facing the other fixed armature formed by the remaining part of the rigidity layer 30. A device that conforms to FIG. 14 makes it possible to reduce any influences between the fixed armature formed by the electrode 29 and that formed by the remaining part of the rigidity layer 30.

Although the preceding description is limited to illustrating simple embodiments, it should be pointed out that the device of the invention may be produced with different forms of armatures. Moreover, the production method may advantageously be used for the collective formation of a large number of variable capacitance devices, identical or not, in a single substrate.

Documents Cited (1)

TOPICAL REVIEW—"RF MENS from a device perspective",

J. JASON Yao

J. Micromech. Microeng. 10 (2000) R9–R38

(2)

U.S. Pat. No. 4,653,326

(3)

U.S. Pat. No. 5,495,761

(4)

U.S. Pat. No. 5,576,250

What is claimed is:

1. Integrated variable capacitance device comprising at least one membrane (12), forming at least one mobile armature, and having at least one principal face facing at least one fixed armature (22, 30), characterised in that the membrane is integral with at least one rigidity rib (32) lying in a perpendicular direction to said principal face.

2. Device according to claim 1, comprising a substrate (22) for supporting the membrane, the substrate forming at least one fixed armature.

3. Device according to claim 2, in which the substrate has an electrically conductive layer (28, 29) forming the fixed armature.

4. Device according to claim 1, in which the substrate comprises a first part (22, 29) arranged facing a first principal face of the membrane (12) and a second part (30), integral with the first part, and arranged facing a second principal face of the membrane, at least one of the first and second parts forming a fixed armature.

5. Device according to claim 4, in which the second part (30) is a rigid electrically conductive layer.

* * * * *